US009755066B2

(12) United States Patent
Laforet et al.

(10) Patent No.: US 9,755,066 B2
(45) Date of Patent: Sep. 5, 2017

(54) REDUCED GATE CHARGE FIELD-EFFECT TRANSISTOR

(71) Applicant: Infineon Technologies Austria AG, Villach (AT)

(72) Inventors: David Laforet, Villach (AT); Li Juin Yip, Villach (AT); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/954,499

(22) Filed: Nov. 30, 2015

(65) Prior Publication Data
US 2017/0154993 A1    Jun. 1, 2017

(51) Int. Cl.
*H01L 21/336* (2006.01)
*H01L 29/78* (2006.01)
*H01L 29/66* (2006.01)
*H01L 29/10* (2006.01)

(52) U.S. Cl.
CPC ........ *H01L 29/7813* (2013.01); *H01L 29/105* (2013.01); *H01L 29/1095* (2013.01); *H01L 29/66734* (2013.01)

(58) Field of Classification Search
CPC ........... H01L 29/4236; H01L 29/66704; H01L 29/66734; H01L 29/7813; H01L 29/1095; H01L 29/42368; H01L 29/401; H01L 21/28114; H01L 21/02164; H01L 21/02233; H01L 21/0455; H01L 21/761; H01L 29/8083
USPC ..... 438/270, 259; 257/330, E29.262, E21.41
See application file for complete search history.

(56) References Cited

U.S. PATENT DOCUMENTS

| 8,174,070 | B2 * | 5/2012 | Mallikarjunaswamy | H01L 21/823807 257/331 |
| 9,000,514 | B2 * | 4/2015 | Lee | H01L 29/407 257/330 |
| 2009/0078995 | A1 * | 3/2009 | Nakagawa | H01L 29/7813 257/330 |
| 2013/0001679 | A1 * | 1/2013 | Omori | H01L 21/76897 257/330 |

* cited by examiner

*Primary Examiner* — Sonya D McCall Shepard
(74) *Attorney, Agent, or Firm* — Murphy, Bilak & Homiller, PLLC

(57) ABSTRACT

In one implementation, a reduced gate charge field-effect transistor (FET) includes a drift region situated over a drain, a body situated over the drift region, and source diffusions formed in the body. The source diffusions are adjacent a gate trench extending through the body into the drift region and having a dielectric liner and a gate electrode situated therein. The dielectric liner includes an upper segment and a lower segment, the upper segment extending to at least a depth of the source diffusions and being significantly thicker than the lower segment.

14 Claims, 6 Drawing Sheets

REDUCED GATE CHARGE FIELD-EFFECT TRANSISTOR

BACKGROUND

Vertical power transistors, such as group IV based trench type field-effect transistors (trench FETs), are used in a variety of applications. For example, silicon based trench metal-oxide-semiconductor FETs (trench MOSFETs) may be used to implement a power converter, such as a synchronous rectifier, or a direct current (DC) to DC power converter.

For many trench MOSFET applications in which high switching speeds are necessary or desirable, it is advantageous to reduce gate charge so as to reduce switching loss. In addition, as the electronic devices and systems utilizing power MOSFETs are continually reduced in size, there is a corresponding need to reduce the size of the MOSFETs themselves. However, the resulting reduction in cell pitch and increased power density tends to undesirably increase gate charge in conventional trench MOSFET structures.

SUMMARY

The present disclosure is directed to a reduced gate charge field-effect transistor (FET), substantially as shown in and/or described in connection with at least one of the figures, and as set forth in the claims.

DETAILED DESCRIPTION

Figure 1:
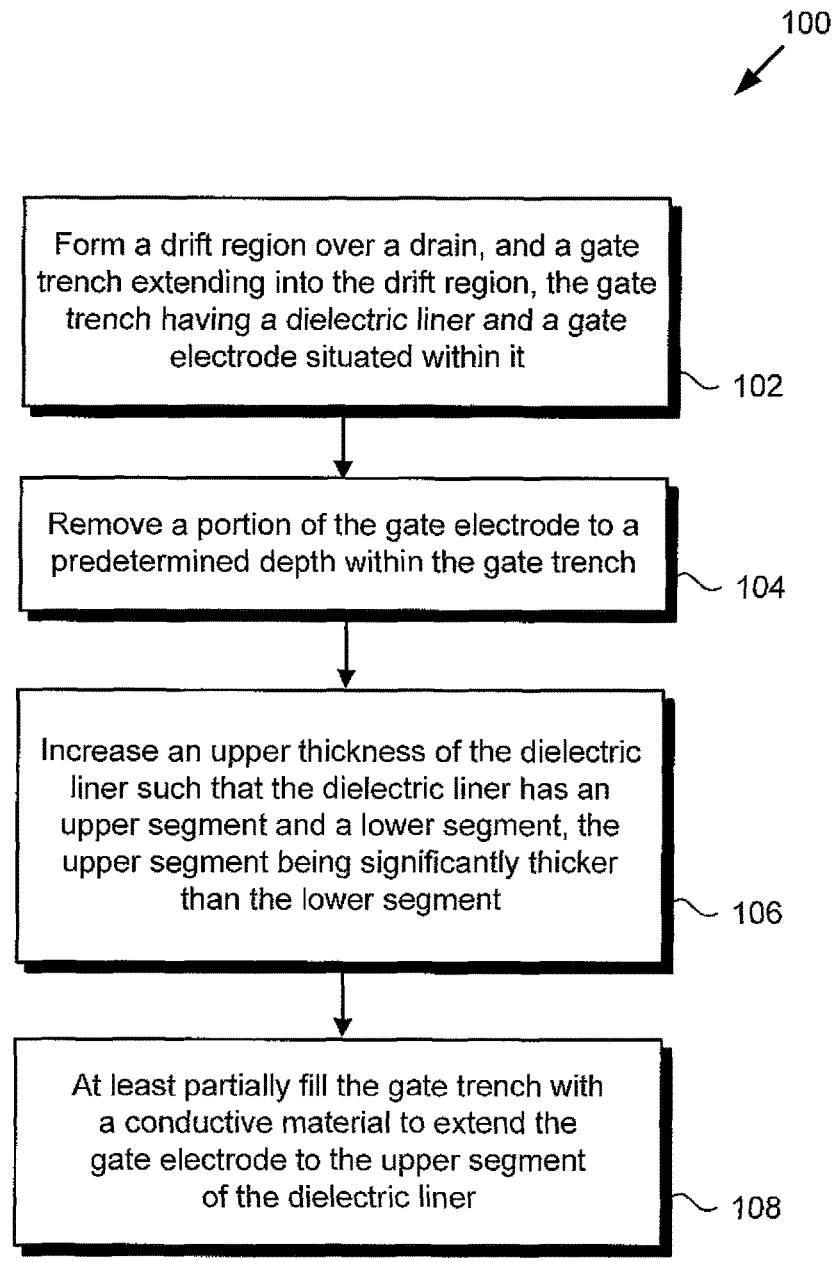
FIG. 1 is flowchart presenting an exemplary method for fabricating a reduced gate charge field-effect transistor, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows flowchart 100 presenting an exemplary method for fabricating a reduced gate charge field-effect transistor (FET). The exemplary method described by flowchart 100 is performed on a portion of a substrate, which may be implemented so as to provide an active die for a power transistor, such as a silicon or other group IV based vertical metal-oxide-semiconductor FET (MOSFET).

Figure 2A:
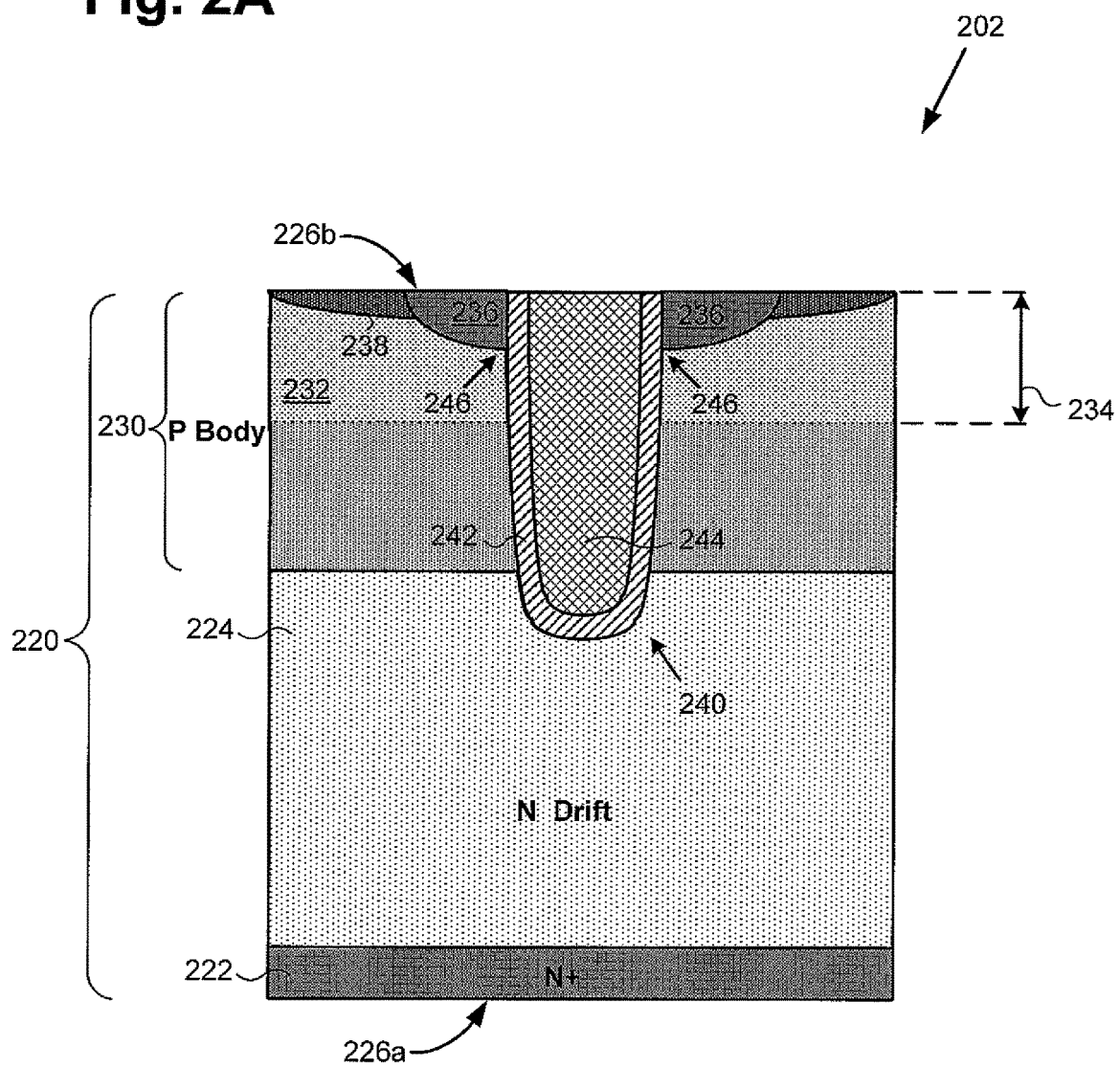
FIG. 2A shows a cross-sectional view illustrating a result of performing an initial action of the exemplary flowchart of FIG. 1, according to one implementation.
Figure 2B:
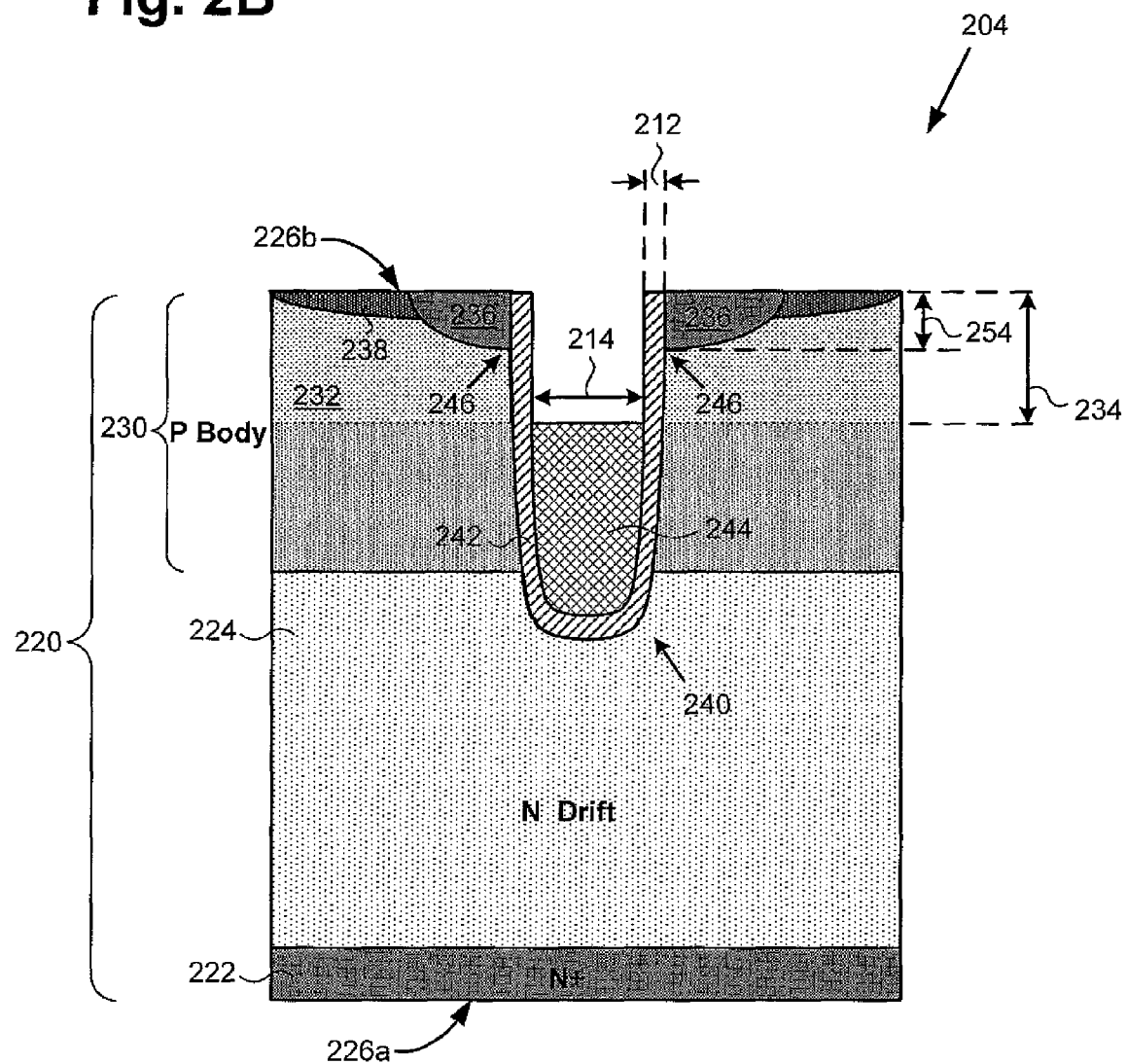
FIG. 2B shows a cross-sectional view illustrating a result of performing a subsequent action of the exemplary flowchart of FIG. 1, according to one implementation.
Figure 2C:
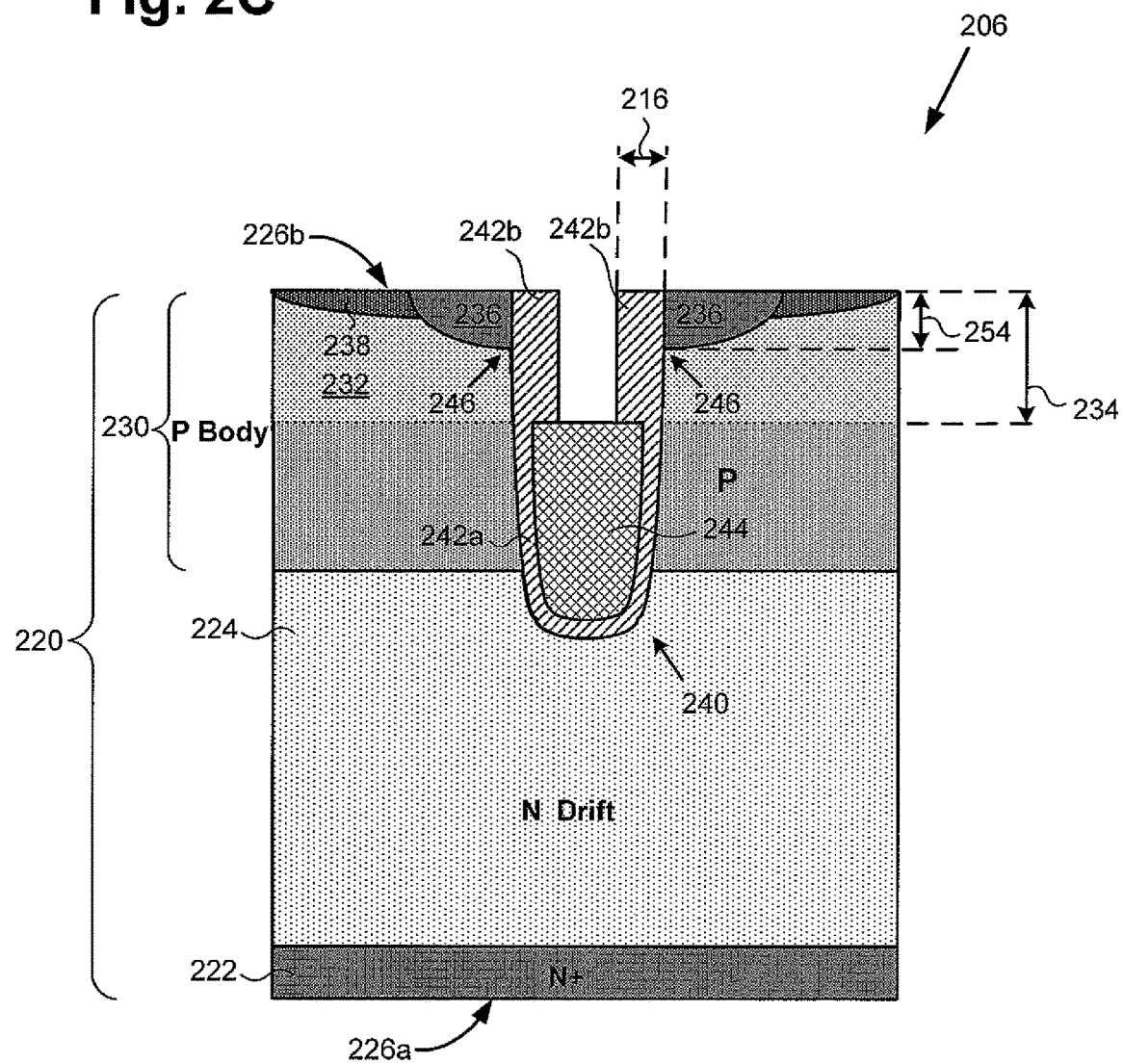
FIG. 2C shows a cross-sectional view illustrating a result of performing a subsequent action of the exemplary flowchart of FIG. 1, according to one implementation.

With respect to FIGS. 2A, 2B, 2C, and 2D, structures 202, 204, 206, and 208 shown respectively in those figures illustrate the result of performing the method of flowchart 100, according to one implementation. For example, structure 202, in FIG. 2A, provides a cross-sectional view of substrate 220 including N type drain 222, N type drift region 224 formed over N type drain 222, and gate trench 240 extending into N type drift region 224 and including dielectric liner 242 and gate electrode 244 (action 102). Structure 204, in FIG. 2B, is a cross-sectional view of structure 202 after removal of a portion of gate electrode 240 (action 104). Structure 206, in FIG. 2C, is a cross-sectional view of structure 204 after upper thickness 216 of dielectric liner 242 is increased such that dielectric liner 242 includes upper segment 242b and lower segment 242a (action 106), and so forth.

Referring to flowchart 100, in FIG. 1, in combination with FIG. 2A, flowchart 100 begins with forming N type drift region 224 over highly doped N type drain 222, and gate trench 240 extending into N type drift region 224, gate trench 240 having dielectric liner 242 and gate electrode 244 situated within it (action 102). As shown in the cross-sectional view of FIG. 2A, highly doped N type drain 222 is situated at bottom surface 226a of substrate 220.

As further shown by structure 202 in FIG. 2A, substrate 220 also includes P type body 230 situated over N type drift region 224. P type body 230 includes lower doped P type body region 232 and highly doped P type body contacts 238. Highly doped N type source diffusions 236 are formed in P type body 230 and are situated adjacent gate trench 240, which extends through P type body 230 and into N type drift region 224. Also shown in FIG. 2A are channel regions 246 adjacent gate trench 240, top surface 226b of substrate 220, and depth 234 of lower doped P type body region 232 within P type body 230.

Substrate 220 may be implemented as a group IV based substrate, such as a silicon (Si) substrate or a silicon carbide (SiC) substrate, for example. Moreover, in some implementations, substrate 220 may include N type drift region 224 and P type body 230 formed in an epitaxial silicon layer of substrate 220. Formation of such an epitaxial silicon layer may be performed by any suitable method, as known in the art, such as chemical vapor deposition (CVD) or molecular beam epitaxy (MBE), for example. More generally, however, N type drift region 224 and P type body 230 may be formed in any suitable elemental or compound semiconductor layer included in substrate 220.

Thus, in other implementations, N type drift region 224 and P type body 230 need not be formed through epitaxial growth, and/or need not be formed of silicon. For example, in one alternative implementation, N type drift region 224 and P type body 230 can be formed in a float zone silicon layer of substrate 220. In other implementations, N type drift region 224 and P type body 230 can be formed in either a strained or unstrained germanium layer formed as part of substrate 220.

P type body 230 including lower doped P type body region 232, and highly doped P type body contacts 238 may be formed by implantation and thermal diffusion. For example, boron (B) dopants may be implanted into substrate 220 and diffused to form P type body 230 including lower doped P type body region 232, and highly doped P type body contacts 238. By analogy, highly doped N type source diffusions 236 may be fouled by implantation and thermal diffusion of a suitable N type dopant in substrate 220. Such a suitable N type dopant may include arsenic (As) or phosphorous (P), for example.

Gate electrode 244 may be formed using any electrically conductive material typically utilized in the art. For example, gate electrode 244 may be formed of doped polysilicon or metal. Dielectric liner 242 insulating gate electrodes 240 from highly doped N type source diffusions 236, P type body 230, and N type drift region 224 may be formed using any material and any technique typically employed in the art. For example, dielectric liner 242 may be formed of silicon dioxide ($SiO_2$), and may be deposited or thermally grown to produce dielectric liner 242.

Figure 2D:
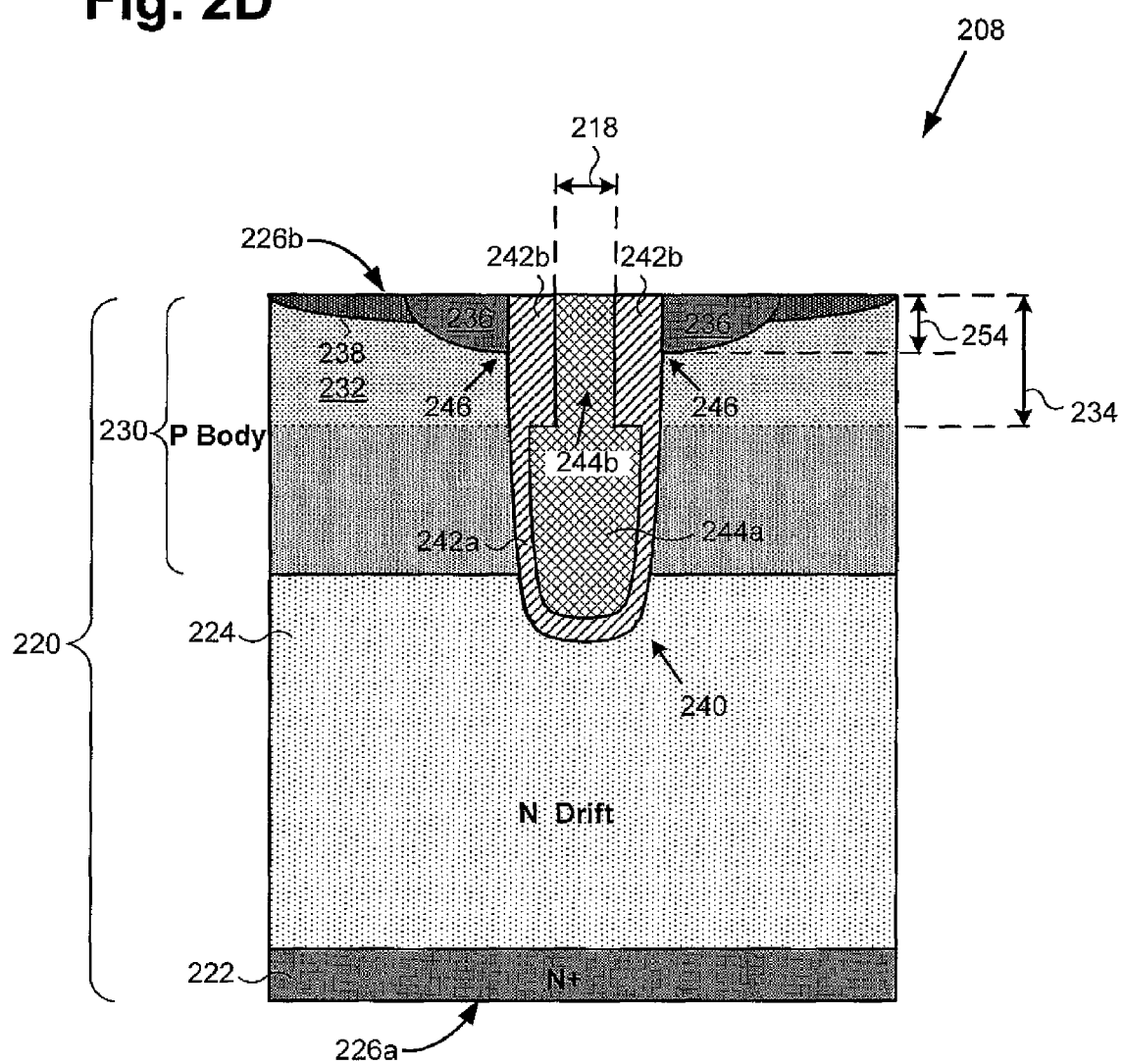
FIG. 2D shows a cross-sectional view illustrating a result of performing a final action of the exemplary flowchart of FIG. 1, according to one implementation.
Figure 3:
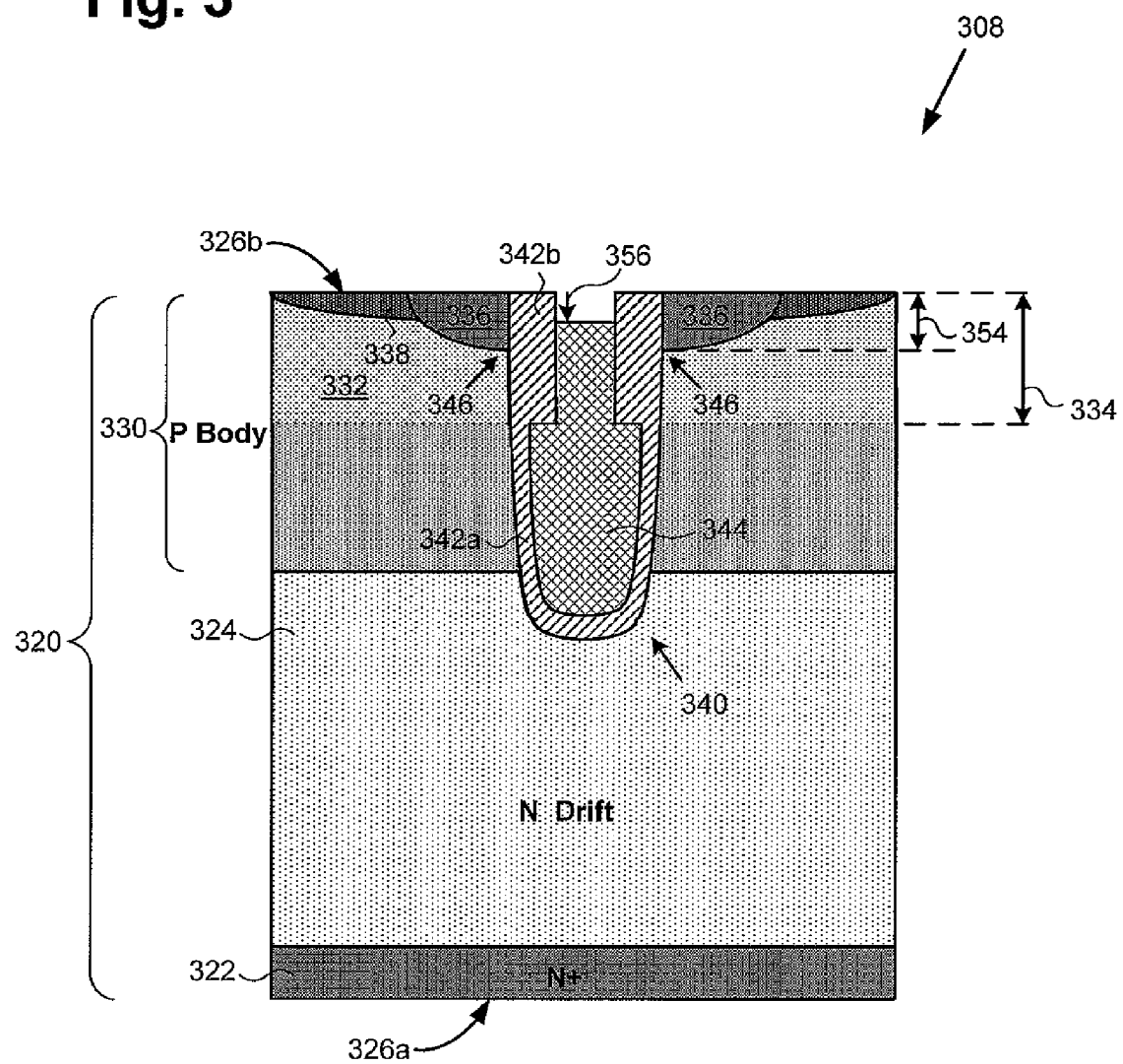
FIG. 3 shows a cross-sectional view illustrating a result of performing a final action of the exemplary flowchart of FIG. 1, according to another implementation.

It is noted that although the implementation shown in FIGS. 2A, 2B, 2C, and 2D, as well as subsequent FIG. 3, depict substrate 220 as providing an n-channel vertical FET having N type drain 222, N type drift region 224, P type body 230, and N type source diffusions 236, that representation is merely exemplary. In other implementations, the described polarities can be reversed such that substrate 220 may provide a p-channel device having a P type drain, a P type drift region, an N type body, and P type source diffusions.

It is further noted that in the interests of ease and conciseness of description, the present inventive principles will in some instances be described by reference to specific implementations of a silicon based vertical power FET. However, it is emphasized that such implementations are merely exemplary, and the inventive principles disclosed herein are broadly applicable for use with a wide variety of device types.

Moving to FIG. 2B, with continued reference to flowchart 100, in FIG. 1, flowchart 100 continues with removing a portion of gate electrode 244 to predetermined depth 254 within gate trench 240 (action 104). In addition to predetermined depth 254, structure 204 in FIG. 2B shows width 212 of dielectric liner 242, and width 214 of gate electrode 244 below predetermined depth 254.

It is noted that predetermined depth 254 and depth 234 of lower doped P type body region 232 will typically be substantially equal to one another in substrate 220. Predetermined depth 254 and depth 234 of lower doped P type body region 232 are shown as different depths in FIG. 2B for conceptual purposes, in order to indicate that predetermined depth 254 may assume a range of values. That is to say, although predetermined depth 254 extends to at least the depth of highly doped N type source diffusions 236 below top surface 226b of substrate 220, as shown in FIG. 2B, predetermined depth 254 may extend below the depth of highly doped source diffusions 236 to extend into channel regions 246. For example, as shown in FIG. 2B, predetermined depth 254 may extend to depth 234, below highly doped N type source diffusions 236 but above N type drift region 224.

Referring now to FIG. 2C, with continued reference to flowchart 100, in FIG. 1, flowchart 100 continues with increasing upper thickness 216 of dielectric liner 242 such that dielectric liner 242 includes upper segment 242b and lower segment 242a, upper segment 242b being significantly thicker than lower segment 242a (action 106). As shown by structure 206, upper segment 242b of dielectric liner 242 has upper width 216 and adjoins highly doped N type source diffusions 236.

As further shown by structure 206, upper segment 242b of dielectric liner 242 having upper width 216 extends to predetermined depth 254, which is at least as deep as highly doped N type source diffusions 236 and may extend below highly doped N type source diffusions 236, as shown by depth 234. However, it is noted that depth 234 terminates within P type body 230. As a result, upper segment 242b of dielectric liner 242 is entirely situated above N type drift region 224.

It is also noted that the doping concentration of P type body 230 can be reduced adjacent upper segment 242b of dielectric liner 242. As a result, P type body 230 may include lower doped P type body region 232 extending to a depth 234, which corresponds to predetermined depth 254 and extends below top surface 226b of substrate 220 to at least the depth of highly doped N type source diffusions 236. However, and as discussed above, depth 234 may extend below highly doped N type source diffusions 236.

Upper thickness 216 of dielectric liner 242 may be a conformally deposited or grown dielectric, such as $SiO_2$, and may be formed on exposed portions of dielectric liner 242. In some implementations, upper thickness 216 of dielectric liner 242 may be increased using the same dielectric material used to form thickness 212 of dielectric liner 242, shown in FIG. 2B. In other implementations, however, some it may be advantageous or desirable to increase upper thickness 216 of dielectric liner 242 using a different dielectric material than that used to form thickness 212 of dielectric liner 242, such as silicon nitride ($Si_3N_4$), for example.

As stated above, upper segment 242b of dielectric liner 242, having thickness 216, is significantly thicker than lower segment 242a of dielectric liner 242, having thickness 212. For example, upper segment 242b may be from approximately 1.5 to approximately 2.5 times as thick as lower segment 242a, such as approximately twice as thick as lower segment 242a.

According to the exemplary implementation shown by FIGS. 2A, 2B, 2C, and 2D, the actions of flowchart 100 are performed on substrate 220 in which P type body 230 and highly doped N type source diffusions 236 have previously been formed. However, that representation is provided merely as an example, and in other implementations, P type body 230 and highly doped N type source diffusions 236 may be formed after increasing upper thickness 216 of dielectric liner 242 such that dielectric liner 242 includes upper segment 242b and lower segment 242a. In implementations in which P type body 230 and highly doped N type source diffusions 236 are formed after increasing upper thickness 216 of dielectric liner 242, predetermined depth 254 may be identified based on the designed depth of highly doped N type source diffusions 236 in substrate 220.

Continuing to FIG. 2D, flowchart 100 can conclude with at least partially filling gate trench 240 with a conductive material to extend gate electrode 244 to upper segment 242b of said dielectric liner 242 (action 108). According to the exemplary implementation shown by structure 208, action 108 results in gate electrode 244 having lower portion 244a having width 214 (width 214 shown in FIG. 2B), and upper portion 244b having width 218 and substantially filling gate trench 240 to top surface 226b of substrate 220. As shown in FIG. 2D, gate electrode 244 is significantly narrower adjacent upper segment 242b of dielectric liner 242. That is to say, width 218 of upper portion 244b of gate electrode 244 is significantly less than width 214 of lower portion 244a of gate electrode 244.

Formation of thick upper segment 244b of dielectric liner 242 extending at least to the depth of highly doped N type source diffusions 236 but less than the depth of N type drift region 224 reduces gate charge and improves switching efficiency. Moreover, because lower doped P type body region 232 may be localized so as to be situated adjacent and adjoin, thick upper segments 244b, the present solution for reducing gate charge can substantially minimize the affect of lower doped P type body region 232 on drain induced barrier lowering (DIBL). As a result, structure 208, in FIG. 2D can be used to implement a reduced gate charge FET advantageously providing reduced switching loss in both hard switching and synchronous rectification applications.

Referring to FIG. 3, FIG. 3 shows reduced gate charge FET structure 308, according to another exemplary implementation. It is noted that the features in FIG. 3 identified by reference numbers corresponding to reference numbers shown in FIG. 2A, 2B, 2C, or 2D, correspond in general to those respective features and may share any of the characteristics attributed to those corresponding features above. Thus, for example, upper dielectric liner segment 342b and lower dielectric liner segment 342a, P type body 330 including lower doped P type body region 332, and highly doped N type source diffusions 336 correspond respectively to upper segment 242b and lower segment 242a of dielectric liner 242, P type body 230 including lower doped P type body region 232, and highly doped N type source diffusions 236, in FIGS. 2A, 2B, 2C, and 2D.

In contrast to reduced gate charge FET structure 208, in FIG. 2D, however, reduced gate charge FET structure 308, in FIG. 3 includes recessed gate electrode 344. For example, and as shown in FIG. 3, gate electrode 344 is recessed to a depth 356 below top surface 326b of substrate 320, within gate trench 340. As a result, the overlap of gate electrode 344 with highly doped N type source diffusions 336 is reduced relative to structure 208, in FIG. 2D, thereby further reducing gate charge in structure 308. Thus, structure 308 can be used to implement a reduced gate charge FET providing further reduction in switching loss in both hard switching and synchronous rectification applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for fabricating a reduced gate charge field-effect transistor (FET), said method comprising:
forming a drift region over a drain, and a gate trench extending into said drift region, said gate trench having a dielectric liner and a gate electrode situated therein;
removing a portion of said gate electrode to a predetermined depth within said gate trench;
increasing an upper thickness of said dielectric liner such that said dielectric liner comprises an upper segment and a lower segment, said upper segment extending to said predetermined depth and being significantly thicker than said lower segment;
at least partially filling said gate trench with a conductive material to extend said gate electrode to said upper segment of said dielectric liner.

2. The method of claim 1, wherein said upper segment of said dielectric liner is situated above said drift region.

3. The method of claim 1, further comprising forming a body over said drift region, and forming source diffusions in said body, wherein said upper segment of said dielectric liner extends to at least a depth of said source diffusions.

4. The method of claim 3, wherein said upper segment of said dielectric liner extends below said depth of said source diffusions.

5. The method of claim 3, wherein a doping concentration of said body is reduced adjacent said upper segment of said dielectric liner.

6. The method of claim 3, wherein formation of said body and said source diffusions is performed after increasing said upper thickness of said dielectric liner to produce said upper segment.

7. The method of claim 1, wherein said upper segment of said dielectric liner is approximately twice as thick as said lower segment.

8. The method of claim 1, wherein said gate electrode is recessed within said gate trench, adjacent said upper segment of said dielectric liner.

9. The method of claim 1, wherein said reduced gate charge FET is an n-channel FET.

10. The method of claim 1, wherein said reduced gate charge FET is a p-channel FET.

11. The method of claim 1, wherein said upper thickness of said dielectric liner is increased using the same dielectric material used to form an initial thickness of said dielectric liner.

12. The method of claim 1, wherein said upper thickness of said dielectric liner is increased using a different dielectric material than that used to form an initial thickness of said dielectric liner.

13. The method of claim 12, wherein said initial thickness of said dielectric liner is formed using silicon dioxide, and wherein said upper thickness of said dielectric liner is increased using silicon nitride.

14. The method of claim 1, wherein said upper segment of said dielectric liner is approximately 1.5 to approximately 2.5 times as thick as said lower segment.

* * * * *